United States Patent [19]

Bartram

[11] 4,069,468
[45] Jan. 17, 1978

[54] DOPPLER SPECTRAL MEASUREMENT

[75] Inventor: James F. Bartram, Middletown, R.I.

[73] Assignee: Raytheon Company, Lexington, Mass.

[21] Appl. No.: 726,344

[22] Filed: Sept. 24, 1976

[51] Int. Cl.² .............................................. G01S 9/66
[52] U.S. Cl. ...................................... 340/3 D; 343/8
[58] Field of Search ....................... 340/3 D; 343/8, 9

[56] References Cited
U.S. PATENT DOCUMENTS

| 3,610,901 | 10/1971 | Lynch | 343/5 DP |
| 3,721,977 | 3/1973 | Darboven | 343/8 |

Primary Examiner—Richard A. Farley
Attorney, Agent, or Firm—David M. Warren; Joseph D. Pannone; Milton D. Bartlett

[57] ABSTRACT

A system for Doppler frequency measurement, responsive to spectral modulation induced by a reverberant and nonlinear radiation transmissive region such as the ocean, and composed of a Fourier transformer for providing digitally the spectral lines for a set of samples of a Doppler signal, a circuit for obtaining the logarithm of the power spectrum, weighting of the logarithm by othogonal functions, and an arithmetic combination of components of the weighted logarithm.

5 Claims, 6 Drawing Figures

FIG. I

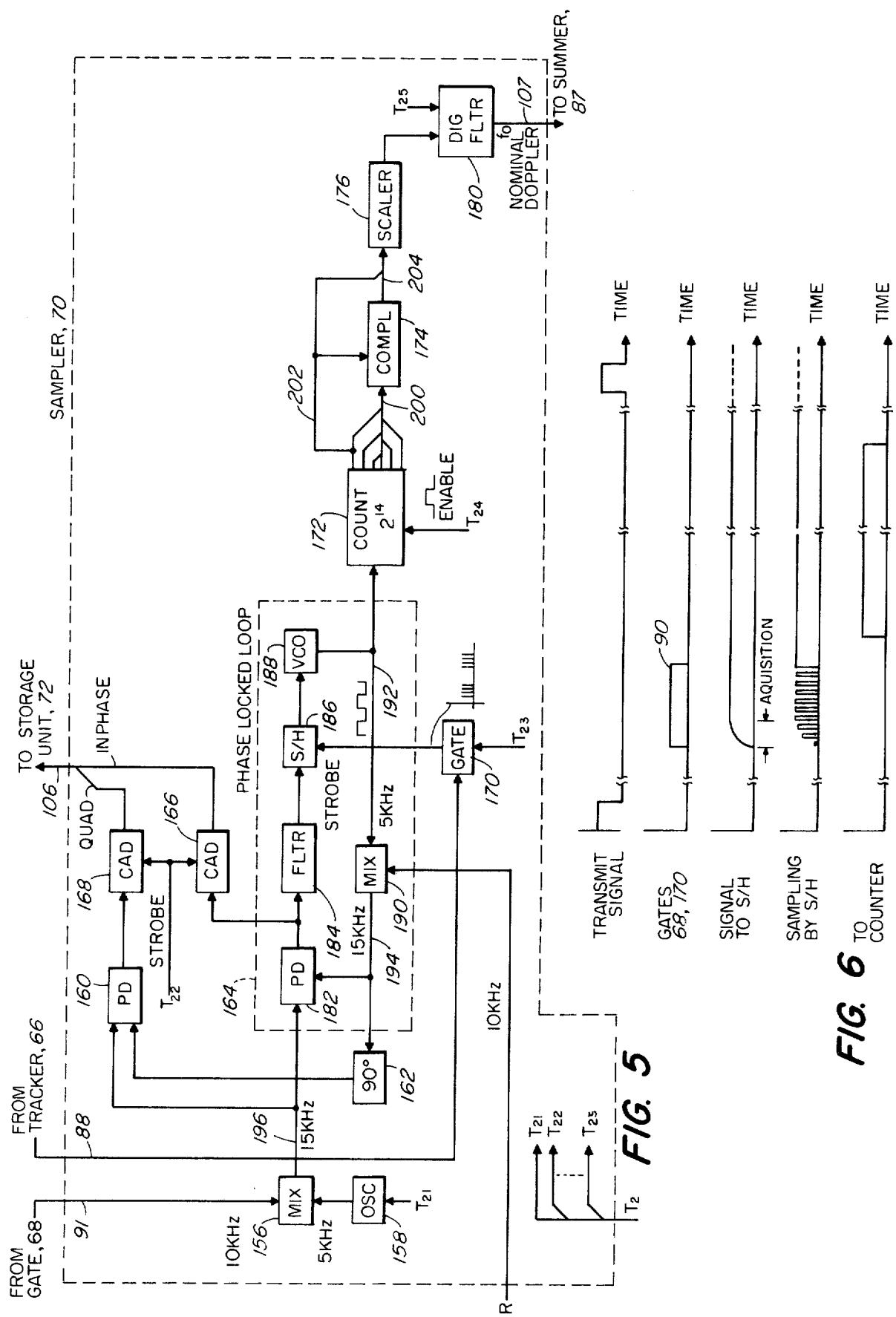

DOPPLER SPECTRAL MEASUREMENT

BACKGROUND OF THE INVENTION

This invention relates to the measurement of Doppler frequency and, more particularly, to the modification of the Doppler power spectrum for extraction of Doppler data therefrom.

The measurement of Doppler frequency is often accomplished by one or more filters which signal the magnitude of the frequency, or by means of timing circuits which provide the time elapsed by a specified number of cycles of the Doppler signal. Such systems are intended for use primarily in a situation providing clear unambiguous Doppler signals.

A problem arises in the case of reverberant and nonlinear radiation transmissive media, such as the ocean which is transmissive of radiant sonic energy, in that such a medium with its multifarious reflecting boundaries, such as mud and rock, alters a Doppler signal. The altered signal is characterized by a broadened spectrum which is inherently ambiguous to Doppler frequency measurement, the spectrum providing many possible values of Doppler frequency which derogate from an accurate measurement of the Doppler frequency.

SUMMARY OF THE INVENTION

The foregoing problem is overcome and other advantages are provided by a system for measuring Doppler frequency in a medium propagative of radiant energy and which, in accordance with the invention, utilizes a receiver providing a set of samples of a Doppler signal received during a predetermined interval of time. The system includes a Fourier transformer coupled to a logarithmic circuit for obtaining the logarithm of the power spectrum of the set of samples. The logarithms are then weighted by orthogonal factors, such as the first few terms of a Legendre series, in a weighting circuit and combined in an arithmetic circuit to give a numerical result which represents Doppler frequency as well as relative speed between the receiver and points of reflection of the radiant energy within the medium.

The theoretical support for the invention is based upon the observation that empirical data of received Doppler spectra of reverberant media, such as the ocean, with nonlinear reflectors, such as air bubbles and mud, has the form of a continuous spectrum approximately centered about a nominal value $f_o$ of the Doppler frequency, the nominal value being the value of Doppler frequency seen by a Doppler tracking filter of the prior art. This spectrum can be portrayed as a function of frequency by a mathematical formulation, namely, an exponential relationship in which the exponent is a summation of terms of an orthogonal series, for example, a Legendre series, wherein the independent variable is proportional to the frequency. Thus the power spectral density $S(\nu)$ of the Doppler spectrum is given by $$S(\nu) = \exp \sum_{n=0}^{N} a_n P_n\left(\frac{\nu}{\nu_m}\right)$$

where $P_n$ is the $n^{th}$ polynomial of the Legendre series
$a_0 = lnS(\nu=0) - \pi(\nu_c^2/W^2) - (\pi/3)(\nu_m^2/W)$
$a_1 = 2\pi(\nu_m \nu_c/W^2)$
$a_2 = (-2\pi/3)(\nu_m^2/W^2)$ for a Gaussian shaped spectrum and
$\nu = f - f_o$
$|\nu| = \leq \nu_m$
and wherein
$f$ is a frequency of the Doppler spectrum;
$f_o$ is the nominal value or estimate of the Doppler frequency;
subscript c denotes the frequency of the peak value of the Doppler spectrum;
subscript m denotes a maximum value of frequency deviation at either side of $f_o$, these being the upper and lower edges of a Doppler spectrum centered on $f_o$;
$W$ is the effective noise bandwidth of the Doppler signal;
$P_n$ is the $n^{th}$ term of the Legendre series.

Comparing the mathematics with the structural components of the invention, it is seen that the logarithmic circuitry retrieves the exponent. Multiplication of the terms of an orthogonal series by the terms of an orthogonal series, this being accomplished in the weighting circuitry, produces nonzero products for commonly indexed terms of the series. It is noted that the Fourier series is also an orthogonal function. Combination of the products by the arithmetic circuitry to produce the Doppler frequency, namely $f_c$, is accomplished by a formulation, to be disclosed hereinafter, which may be varied in accordance with sea state and ocean bottom characteristics to optimize the accuracy of the system.

BRIEF DESCRIPTION OF THE DRAWINGS

The aforementioned aspects and other features of the invention are explained in the following description taken in connection with the accompanying drawings wherein:

FIG. 5 is a block diagram of a sampler of FIG. 3; and

FIG. 6 is a timing diagram useful in explaining the operation of the receiver of FIG. 3 and the sampler of FIG. 5.

DESCRIPTION OF THE PREFERRED EMBODIMENT

Figure 1:
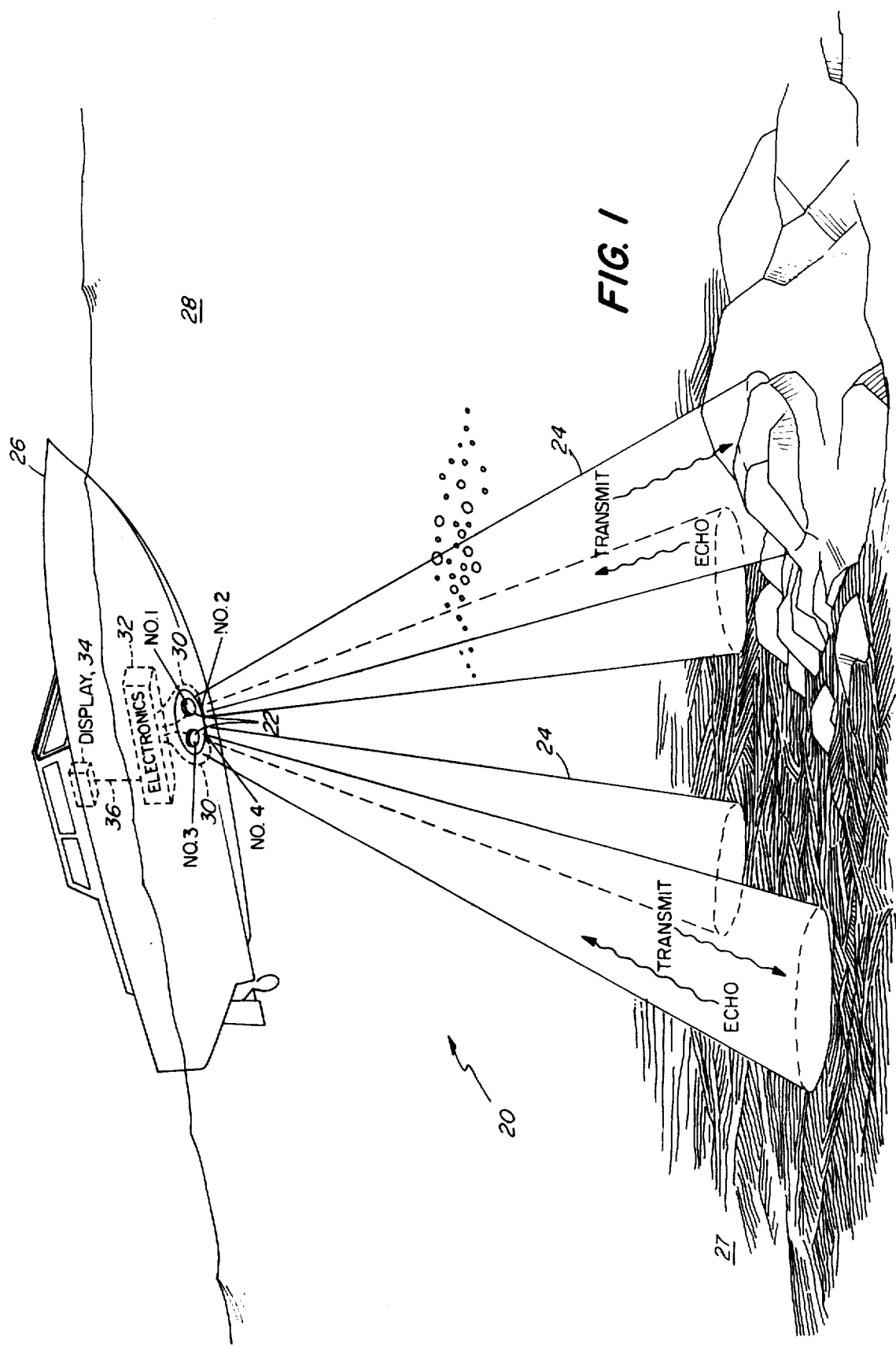
FIG. 1 is a stylized view of a ship carrying a sonar system embodying the invention, the drawing showing the radiation of four beams of sonic energy through the water of the ocean.

Referring now to FIG. 1, there is seen a stylized view of a sonar system 20 embodying the invention and including a set of four transducers 22 which are symmetrically positioned about a vertical axis and inclined thereto at an angle of approximately 25 degrees for directing four beams 24 of sonic energy in diverging directions from the hull of a ship 26 and downwardly towards the bottom 27 of the ocean 28. The transducers 22 are secured to the hull of the ship 26 and are coupled via lines 30 to an electronics unit 32, the figure also showing a display 34 in the bridge of the ship 26 and coupled to the electronics unit 32 by line 36. Individual ones of the transducers 22 are further identified by the numerals 1–4 of which the transducers #1 and #2 are positioned forward of the transducers #3 and #4, the transducers #1 and #3 being on the starboard side while the transducers #2 and #4 are on the port side of the ship 26.

FIG. 1 also shows wavy lines representing the transmission of sonic energy signals towards the bottom 27 and echoes of sonic energy therefrom. Echoes are also received from bubbles of air within the water as well as from rocks and mud on the bottom of 27, the frequency spectrum of the echo being modified from that of the transmitted signal by virtue of interaction of the sonic energy with the air bubbles, the rocks, or the mud. In addition, the spectrum of the echo has a Doppler shift in frequency imparted thereto by virtue of relative motion between the ship 26 and the air bubbles, the rocks, and the mud.

Figure 2:
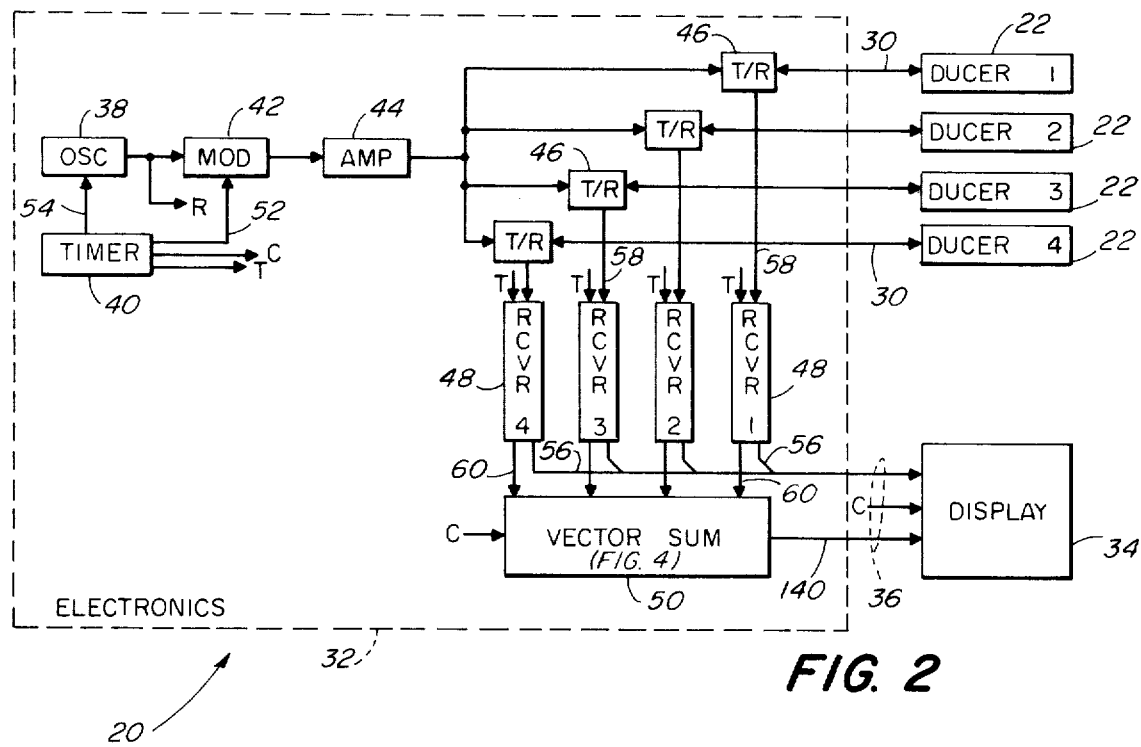
FIG. 2 is a block diagram of an electronics unit shown in FIG. 1 and including sonar receivers constructed in accordance with the invention.

Referring to FIG. 2, the block diagram shows the components of the electronics unit 32 and its interconnections by the lines 30 and 36 to the transducers 22 and the display 34, of FIG. 1. The electronics unit 32 comprises an oscillator 38, a timer 40, a modulator 42, an amplifier 44, transmit-receive circuits 46, receivers 48, and a vector summer 50. The amplifier 44 is coupled to each of the transmit-receive circuits 46 whereby electrical energy is coupled to each of the transducers 22 for the radiation of sound therefrom, the electrical signals generated by the transducers 22 in response to the reception of sonic echoes being coupled via individual ones of the transmit-circuits 46 to individual ones of the receivers 48. The transmitted signal comprises, in a preferred embodiment of the invention, a pulsed sinusoid wherein the sinusoid frequency is provided by the oscillator 38 and the pulsations of the sinusoid are provided by the modulator 42, the modulator 42 being an amplitude modulator which pulses an output signal of the oscillator 38 in response to timing signals applied via line 52 from the timer 40. If desired, oscillations of the oscillator 38 may be synchronized to the operation of the modulator 42 by timing signals on line 54 from the timer 44 locking the oscillations to the timing of the modulator 42. An electrical signal produced by the modulator 42 is amplified by the amplifier 44 and then coupled to the transducers 22 for the transmission of the sonic energy therefrom. Also shown in FIG. 2 are timing signals via terminals T for synchronizing the operation of the receivers 48 to the transmission of sonic energy by the transducers 22, the figure also showing clock pulse signals coupled by terminal C to the display 34 and the summer 50 for the synchronization of their operations to that of the receivers 48.

Figure 3:
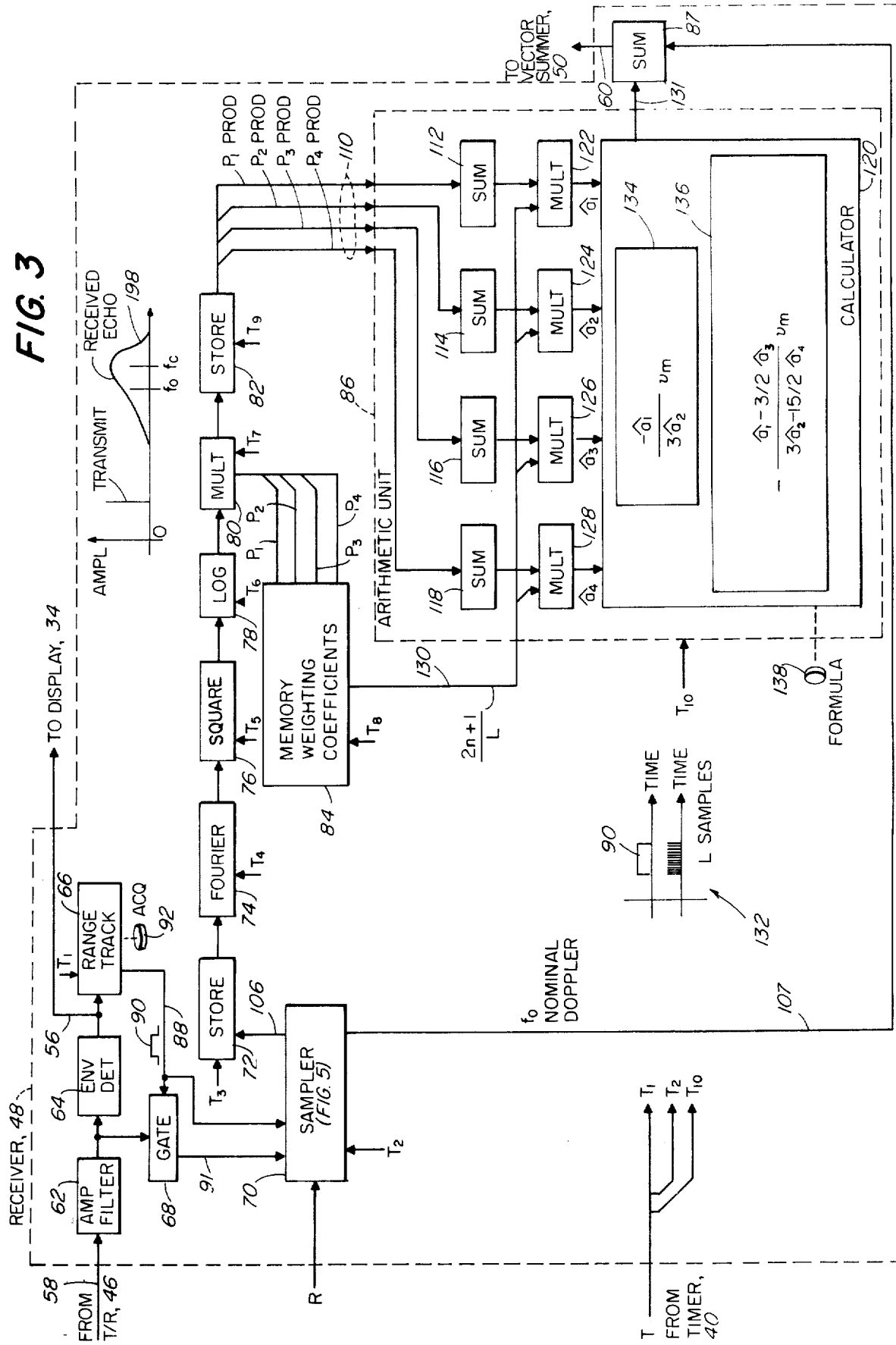
FIG. 3 is a block diagram of a receiver of FIG. 2 showing a Fourier transformer, a logarithmic unit, and a weighting unit in accordance with the invention, the Figure including a graph of the Doppler spectrum showing the aforementioned mathematical terms $f_o$ and $f_c$.

Referring now to FIG. 3, there is seen a block diagram of one of the four receivers 48 of FIG. 2 with its interconnections to the display 34 via line 56, from the transmit-receive circuit 46 via line 58, to the summer 50 via line 60, and its interconnections to the timer 40 via the terminal T. The receiver 48 comprises an amplifier 62, an envelope detector 64, a range tracker 66, a gate 68, a sampler 70, a storage unit 72, a Fourier transformer 74, a squaring unit 76, a logarithmic unit 78, a multiplier 80, a storage unit 82, a memory 84, an arithmetic unit 86, and a summer 87.

The amplifier 62 receives echo signals from a transducer 22 via line 58 and amplifies the signals to a suitable value for operating the envelope detector 64 and the sampling circuit 70. In addition, the amplifier 62 includes a bandpass filter having a bandwidth sufficiently narrow to exclude spectral components of noise lying outside the spectrum of the signal on line 58. The detector 64 detects the envelope of the signal coupled thereto from the amplifier 62, the detector 64 providing a pulse signal with said envelope on line 56 to the display 34 and to the range tracker 66. Terminals T1–T10 are seen fanning out of terminal T, the timing signal of terminal T1 being utilized for driving the range tracker 66, the terminals T2–T10 being utilized for other components of the receiver 48 as will be described below. Thereby the operation of the components of the receiver 48 are synchronized with the operation of the system 20 of FIG. 2.

The tracker 66 tracks the occurrences of the pulse signals on line 56 and provides a gate signal on line 88, such as are presented by the waveform 90, for operating the gate 68 to couple signals via line 91 to the sampler 70 from a time immediately preceding the occurrence of the echo signal on line 58 to a time immediately after the occurrence of the echo signal on line 58. Thereby a signal from the output terminal of the amplifier 62 can only be coupled to the sampler 70 during an interval of time when the echo signal on line 58 is anticipated. Accordingly, the receiver 48 is rendered insensitive to signals other than echoes emanating from the reflecting objects in the ocean 28 of FIG. 1 at a predetermined range from the ship 26. A knob 92, attached to the tracker 66, is operated manually during an acquisition mode for locking the tracker 66 onto an echo selected from echoes presented on the display 34 via the line 56.

In accordance with the invention, the echo signal coupled to the sampler 70 is sampled in response to timing signals applied thereto at terminal T2 from the timer 40, the sampler 70 including circuitry for converting inphase and quadrature analog samples to digital samples represented by digital numbers. The sampler 70 also comprises a phase locked loop, as will be described hereinafter, for offsetting the echo signal in frequency by $f_o$, the nominal Doppler frequency, so that the samples relate to the Doppler spectrum centered about $f_o$. During the duration of the waveform 90, the sampler 70 is operated at successive instances of time by signals at terminal T2 to provide a set of the digital samples of the echo signal, these samples being coupled to the storage unit 72 via line 106 in response to strobing signals provided at terminal T3. The nominal Doppler frequency appears on line 107.

In accordance with the invention, the set of stored complex numbers in the storage unit 72 is converted by the transformer 74 to a corresponding set of digital numbers representing the spectral lines of the Fourier transformation of the set of numbers in the storage unit 72. In response to timing signals at terminals T4 and T5, each of the digital numbers representing the spectral lines is coupled from the transformer 74 to the squaring unit 76. Thus, the set of output digital signals of the squaring unit 76 represents the power spectrum of the signal coupled by the gate 68. In response to timing signals at the terminals T5 and T6, the digital numbers representing the power spectral lines of the squaring unit 76 are coupled to the logarithmic unit 78 which provides an output signal, namely, a set of digital numbers each of which represents respectively the logarithm of an individual power spectral line.

The weighting of the logarithm by the Legendre polynomials is accomplished by the multiplier 80 and the memory 84, the memory 84 storing digital numbers which serves as weighting coefficients, the numbers being coupled by the lines identified by the legends P1-P4 representing the Legendre polynomials, these lines seen fanning into the line 108. The output signal of the logarithmic unit 78 and the weighting factors on line 108 are multiplied by the multiplier 80 in response to timing signals on terminals T7 and T8 to produce a set of weighted digital numbers. In response to timing signals at terminal T9, the weighted digital numbers are stored in the storage unit 82 in a format of four sets of complex numbers, the four sets corresponding to the situation of the forgoing example in which four terms of the Legendre polynomial are utilized. If five terms or six terms of the polynomial are utilized, then, correspondingly, five or six sets of weighted complex numbers appear in the storage unit 82. The stored values are represented via the lines 110 which show, by way of example, the P1 products, the P2 products, the P3 products and the P4 products. Each of these sets of products may be obtained by multiplying the set of digital numbers from the logarithmic unit 78 by a term of the Legendre polynomials.

The arithmetic unit 86 comprises four summers 112, 114, 116 and 118, a calculator 120, and multipliers 122, 124, 126 and 128 for coupling the individual ones of the summers 112, 114, 116 and 118 to the calculator 120. In response to timing signals at terminals T9 and T10, the summer 112 receives the P1 products from the storage unit 82 and sums them together. The resultant sum and a factor on line 130 are then multiplied together by the multiplier 122 to produce an estimate of a term of the Legendre polynomial, this estimate being presented to the calculator 120. The multiplying factors for each of the multipliers 122-128 are coupled by the line 130 from the memory 84, the formula for the factors being presented in the figure alongside the line 130. The formula has the terms $n$ and $L$ wherein $n$ represents the index of the Legendre coefficient, thus $n=1$ for the P1 products. The term $L$ represents the number of samples taken by the sampler 70 during the duration of the waveform 90 on line 88, the waveform 90 and a set of $L$ samples being shown in the graph 132.

As explained hereinbefore, due to the orthogonality of the Legendre polynomials, multiplication of the P1 products, or other set of products of the storage unit 82, by a term of the Legendre polynomial would result in products of zero value while a nonzero value is obtained only in the case wherein the two factors being multiplied have a common index. However, due to the presence of noise on the samples of the sampler 70 as well as variations in the Doppler signals received at the transducers 22 of FIG. 2 from the idealized modeling of such signals, nonzero values are typically obtained for each term of the P1 products as well as for each term of the other sets of products of the storage unit 82. Thus the summation of the terms of the P1 product of the summer 112 and the subsequent multiplication in the multiplier 122 of the sum by the factor on line 130 produces an estimate of the $a_1$ Legendre coefficient rather than an exact value of the Legendre coefficient. Similar comments apply to the operation of the summer 114 with the multiplier 124 to produce the estimate of the $a_2$ coefficient and also to the operation of the summer 116 with the multiplier 126 as well as the summer 118 with the multiplier of 128 to produce their corresponding coefficient estimates. It is noted that the line 130 is seen to branch out into each of the multipliers 122-128 to produce separate factors for each of the multipliers 122-128 wherein the value of $n$ differs for each of the multipliers 122-128 while the value of $L$ is the same for each of the multipliers 122-128.

The estimates of the Legendre coefficients from the multipliers 122-128 are combined in the calculator 120 to produce a number on line 131 representing $\nu_c$, the normalized frequency at the peak value of the spectrum. The signals representing $\nu_c$ and $f_o$ on lines 131 and 107 are then summed by the summer 87 to produce a digital number on line 60 which represents a magnitude of the Doppler frequency $f_c$ as measured in a coordinate along an axis of one of the beams 24 of FIG. 1. The first of the four receivers 48 of FIG. 2 provides a digital signal on line 60 corresponding to the magnitude of the Doppler frequency for the beam 24 produced by the first of the transducers 22, while the other ones of the receivers 48 produce digital numbers corresponding to the magnitudes of the Doppler frequencies as seen along the beam axes of the corresponding ones of the transducers 22. It is noted that, while the exemplary showing of the preferred embodiment in FIG. 3 utilizes four Legendre coefficients, a still more precise representation of the Doppler frequency can be obtained by using further coefficients of the Legendre series and that the mathematical modeling of the Doppler spectrum by the use of orthogonal functions, particularly the Legendre polynomials, becomes more accurate with the utilization of an increased number of terms of the orthogonal function series. Two alternative formulations shown in the boxes 134 and 136 are utilized by the calculator 120 to exemplify a combination of the Legendre terms and to produce the component of the Doppler frequency on line 60. The formulations shown in the boxes 134 and 136 were derived approximately and depend on parameters such as the air bubbles, the rocks, and the mud referred to earlier in FIG. 1 since these characteristics of the medium through which the sonic radiation propagates affect the shape of the Doppler spectrum. A knob 138 of the calculator 120 permits manual selection of a formula such as that of the box 134 or the box 136 for producing the component of the Doppler frequency on line 60. The formula in box 134 has been found useful for reflection from a uniformly rough hard bottom of the ocean which results in a Gaussian distribution of the spectral lines. The formula in box 136 treats more complex situations such as a combination of the aforementioned hard bottom with organic matter. It is noted that the system 20 of FIGS. 1 and 2 is useful both in situations wherein sound is reflected from the bottom 27 of the ocean 28 as well as from air bubbles within the ocean 28 or other reflecting mechanism such as fish, within the ocean 28. Thus, in very deep water wherein echoes received from the bottom 27 are too weak to operate the sampler 70 of FIG. 3, the system 20 can still operate with reflections received from air bubbles and fish. It is also noted that while the teachings herein are directed to sonic radiation, they are also applicable to electromagnetic radiation propagating through the atmosphere, such as in the case of an airplane flying over the ocean with electromagnetic energy being reflected from the ocean back to the airplane.

Figure 4:
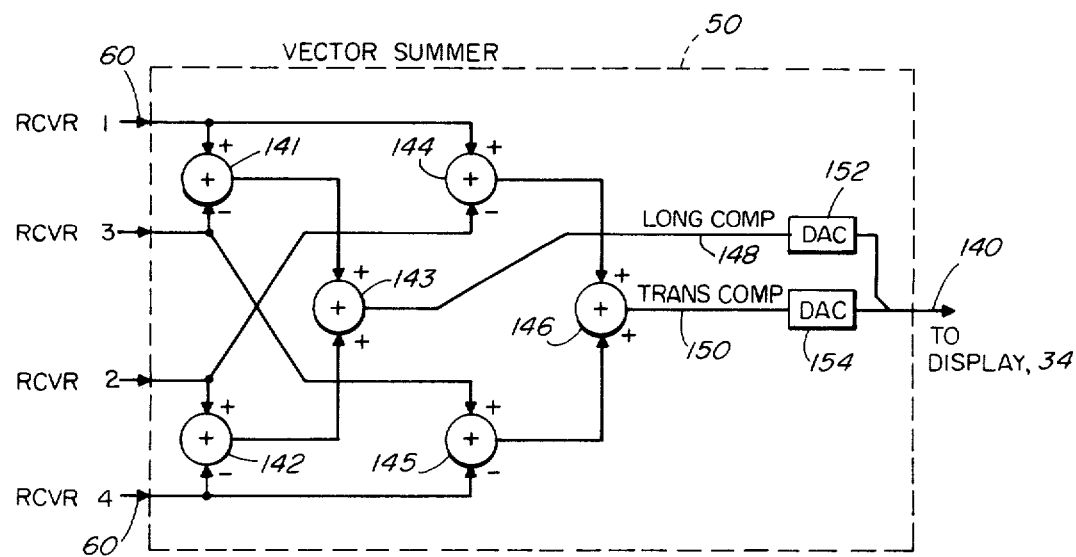
FIG. 4 is a schematic diagram of a vector summation unit of FIG. 2.

Referring now to FIG. 4, there is seen a block diagram of the vector summer 50 and its interconnections to the receivers 48 via the lines 60 and the interconnections to the display 34 via line 140. Apart from a scale factor which is provided by the electronics of the display 34, the summer 50 combines the Doppler frequency components of the beams 24 of FIG. 1 to produce longitudinal and transverse components of the Doppler frequency on the line 140, the longitudinal and the transverse components being in a horizontal plane with the longitudinal component being along the longitudinal or roll axis of the ship 26 of FIG. 1.

The summer 50 is seen to comprise six summers 141-146. The summer 141 subtracts the signal of receiver #3 from the signal of receiver #1 to produce a forward component of the Doppler frequency, or ship speed which is proportioned thereto. Assuming the ship 26 of FIG. 1 to be traveling in the forward direction, the Doppler frequency received at transducer #1 is positive while that received by transducer #3 is negative. Accordingly, the aforementioned subtraction of the signal of the receiver #3 compensates for the negative value of the Doppler frequency in the combining of the signals of the receivers #1 and #3 by the summer 141. Similar comments apply to the combination of the signals of the receivers #2 and #4 by the summer 142. The resulting summations produced by the summers 141 and 142 are applied to the summer 143 wherein they are summed together to produce the longitudinal component of the Doppler frequency on line 148.

Assuming also that the ship 26 may have a transverse component to its velocity and, further assuming that the positive sense of the transverse component is to starboard, it is seen that the subtraction of the signal of receiver #2 from the signal of receiver #1 by the summer 144 produces a portion of the transverse component of the Doppler frequency. The subtraction of the signal of receiver #2 compensates for the negative Doppler frequency shift imparted to signals received by transducer #2 in response to a positive movement of the ship 26. Similar comments apply to the subtraction of the signal of receiver #4 from the signal of receiver #3 by the summer 145. The resulting summations of the summers 144 and 145 are summed together by the summer 146 to produce the transverse component of the Doppler frequency on line 150, or the transverse component of the ship's velocity which is proportional thereto. Digital-to-analog converters 152 and 154 convert the digital numbers representing respectively the longitudinal component and the transverse component-to-analog signals, the analog signals being seen to fan into the line 140 for coupling them to the display 34 of FIG. 2. The display 34, by way of example, utilizes the analog signals representing the longitudinal and the transverse components of the Doppler frequency for energizing the $x$ and $y$ components of a cathode ray tube (not shown) to develop a vector having the magnitude and direction of the maximum value of the Doppler frequency, this being proportional to the ship's velocity.

As noted hereinabove, the beams 24 of FIG. 1 are orientated at approximately 25° to the vertical axis of the ship 26. Thus, it is seen that a horizontal component of the Doppler frequency received along any one of the beams 24 has a magnitude equal to approximately one-half of the magnitude of the Doppler frequency received at the corresponding transducer 22. Thus the aforementioned scale factor would be approximately one-half and, accordingly, the factor one-half is accounted for in the calibration of the display 34.

Referring now to FIG. 5, there is seen a block diagram of the sampler 70, previously seen in FIG. 3. The 70 sampler comprises a mixer 156 coupled via line 91 to the gate 68 of FIG. 3, an oscillator 158, a phase detector 160, a 90° phase shifter 162, a phase-locked loop 164, two converters 166 and 168 of analog-to-digital signals, a gate 170, a counter 172, a complementing unit 174, a scaler 176, and a digital filter 180 which provides the nominal value of Doppler frequency on line 107 to the summer 87 of FIG. 3. The converters 166 and 168 provide inphase and quadrature digital numbers on lines which are seen to fan into line 106 for coupling these digital numbers to the storage unit 72 of FIG. 3. The gate 170 is driven by the signal on line 88 from the tracker 66 of FIG. 3 and functions in the same manner as does the gate 68 of FIG. 3. Terminal T2 provides timing signals from terminal T of FIG. 3, and is seen to have five lines fanning out into terminals T21-25 for providing timing signals to the sampler 70.

The phase-locked loop 164 is seen to comprise a phase detector 182, a low pass filter 184, a sample and hold circuit hereinafter referred to as sampler 186, a voltage controlled oscillator 188, and a mixer 190 which is coupled via terminal R to the oscillator 38 of FIG. 2.

By way of example, the echo signal coupled via line 58 of FIG. 3 and line 91 of FIG. 5 has a carrier frequency of 10 kHz. The oscillator 158 produces a sinusoid at a frequency of 5 kHz which is coupled to the mixer 156, the oscillations of the oscillator 158 being synchronized by a timing signal at terminal T21 to the oscillations of the oscillator 38. The mixer 156, which is understood to include an output filter which passes 15 kHz signals while rejecting signal frequencies of 10 kHz and 5 kHz, provides the echo signal, translated to a 15 kHz carrier, to the phase detector 182 of the loop 164 as well as to the phase detector 160. The oscillator 188 of the loop 164 produces a square wave signal on line 192 having a frequency of 5 kHz, the signal on line 192 being coupled to both the mixer 190 and the counter 172. The mixer 190 combines a 10 kHz sinusoidal signal from terminal R with the signal on line 192 to produce a signal on line 194 having a frequency of 15 kHz, the signal on line 194 being coupled to the phase detector 182, and via the phase shifter 162 to the phase detector 160.

With reference to FIGS. 5 and 6, the phase-locked loop 164 has a sufficiently large bandwidth to permit its acquiring the phase of the signal on line 196 of the mixer 156 during the duration of the waveform 90, previously seen adjacent the line 88 in FIG. 3, and also seen in the second graph of the timing diagram of FIG. 6. The acquisition time of the loop 164 is seen in the third graph of FIG. 6. The difference in phase between the signals on the lines 196 and 194 are detected by the phase detector 182, this difference being filtered by the filter 184 and applied via the sampler 186 to control the frequency of oscillation of the oscillator 188. The filtered difference signal coupled via the filter 184 to the sampler 186 is portrayed in the third graph of FIG. 6. The filtered difference signal has a substantially constant value subsequent to the acquisition of phase lock by the loop 164. In view of the fact that a sample of the transmitted signal is coupled into the loop 164 via terminal R, the oscillator 188 need respond only to variations in Doppler frequency to preserve phase lock of the loop 164, since any variations in the transmitted frequency appearing in the echo signal on line 91 are cancelled out by the mixer 190. The bandwidth of the filter 184 is sufficiently narrow relative to the bandwidths of the other components of the loop 164 such that the loop bandwidth, stability and acquisition time are determined by the bandpass characteristic of the filter 184 and the gain of an amplifier (not shown) contained therein.

Thus, in accordance with the well-known practice in the design of phase-locked loops, the loop 164 acts as a tracking filter to track the phase and frequency of the echo signal on line 91.

With reference to the timing diagram of FIG. 6, it is seen that the gates 68 and 170 are operated for a relatively short interval of time relative to the interval of time between successive pulses of the transmitted signal portrayed in the first graph. Thus, the loop 164 receives a signal on line 196 for a relatively short interval of time with no input signal being received during a major portion of the time interval between successive echo signals. The loop 164 is made responsive to the signal on line 196 only during the time of reception of the echo signal by means of the sampler 186 and the gate 170. Terminal T23 provides timing signals at a rate more than double the bandwidth of the loop 164, for example at a rate of 50 kHz, these timing signals being passed by the gate 170 to strobe the sampler 186. Since the gate 170 is activated by the signal on line 88 as is the gate 68, the strobing of the sampler 186 occurs only at the time when the echo signal is anticipated. Accordingly, when the gate 170 is activated, the sampler 186 samples the signal from the filter 184, holds that sample and couples that sample to the oscillator 188. Upon the next strobing by the next timing signal at terminal T23, the sampler 186 repeats its sampling operation to again sample the signal from the filter 184, hold that sample and apply the sample to the oscillator 188. This sampling procedure is continued repetitively until the termination of the pulsed signal on line 88 at which time the last remaining sample of the sampler 186 is held at a constant value until the gate 170 is again activated at the time when the next echo signal is anticipated. The successive samplings of the sampler 186 is seen in the fourth graph of FIG. 6 which shows the retaining of the last sample during the interval of time subsequent to the termination of the operation of the gate 170. By virtue of the sampler 186 holding its last sample until the next echo, the frequency of the loop 164 is constrained to follow that of the Doppler frequency so that the acquisition time for acquiring the phase of the Doppler signal from subsequent echoes is greatly reduced. Accordingly, the loop 164 is able to function in the manner of a phase-locked loop which tracks a signal that is continuously present, even though the loop 164 must track a signal which is present for a small fraction of the time between successive echoes.

By virtue of the phase shifter 162, the signal on line 194 serves as an inphase reference for the phase detector 182 while serving as a quadrature reference for the phase detector 160. Thus, the output signals of the phase detectors 182 and 160 which are coupled to the converters 166 and 168, respectively, bear inphase and quadrature relationships. The output signals of the phase detectors 182 and 160 are in an analog format, the analog format being converted to digital numbers by the converters 166 and 168 in response to a strobing of the converters 166 and 168 by a timing signal at terminal T22. While the signal on line 196 is substantially that of a pulsed sinusoid, the detection of the signal on line 196 by phase detectors 182 and 160 results in noise-like signals which are produced by the phase detectors 182 and 160. These noise-like signals are characterized by the Doppler spectrum, referred to hereinabove, which is centered at the nominal Doppler frequency. As a result, the digital numbers coupled from the converters 166 and 168 via the line 106 to the storage unit 72 of FIG. 3 represent samples of the Doppler signal translated on the frequency scale by $f_o$, the nominal Doppler frequency. With reference to the graph 198 of FIG. 3 which shows the spectra of the transmitted and received signals, the aforementioned translation of the Doppler spectrum by $f_o$ amounts to a centering of the Doppler spectrum about zero frequency. Since both the inphase and quadrature components of the Doppler signal are coupled via the line 106, the phase and amplitude data within the Doppler spectrum are retained during the translation of the Doppler spectrum to permit the signal processing, in the manner described above, by the components of the receiver 48 of FIG. 3.

The frequency of the signal on line 192 is measured by the counter 172 which counts cycles of the signal on line 192 during an interval of time during which it is enabled by a timing signal at terminal T24, this interval being shown in the bottom graph of FIG. 6. Assuming, by way of example, a maximum Doppler frequency shift of 30 Hz, and that an accuracy on the order of ⅓ Hz is desired, the counter 172 is enabled for an interval of time sufficient to count to the number 16,384, this being 2 raised to the power of 14, for zero Doppler frequency shift. In FIG. 6, this interval of time is shorter than the interval between transmitted signals in which case the period between transmitted signals, or between received echoes, is presumed to be on the order of five seconds or greater. For shorter periods of time, the enabling interval of the counter 172 would extend over a plurality of echoes. Each digit or bit of the count of the counter 172 is seen to be coupled via individual lines which fan into line 200 for coupling to the complementing unit 174. The complementing unit is energized by line 202 which couples the most significant bit of the count to the complementing unit 174 for strobing the complementing unit 174 to take the complement of the multibit digital number representing the count of the counter 172. Either the count or the complement thereof is coupled by the complementing unit 174 to the subtractor 176.

In the event that an echo signal received along one of the beams 24 of FIG. 1 contains a positive Doppler frequency shift, then the frequency of the signal on line 192 is in excess of 5 kHz with the result that the counter 172 counts more than 16,384 counts. The counter 172 counts modulo 16,384 and, accordingly, in the event that, for example, ten additional counts were accumulated during the counting interval, a count of ten would appear on line 200. On the other hand, in the event that a negative Doppler frequency shift were present, the frequency on line 192 would be less than 5 kHz, and the maximum count reached by the counter 172 would be, for example, a count of ten less than the maximum count of 16,384. By energizing the complementing unit 174, the number 10 appears on line 204. The most significant bit which appears on line 202, for energizing the complementing unit 174, also serves as a sign bit to the number appearing on line 204. The line 202 is seen to fan into the line 204 to give both the magnitude and sense of the Doppler signal on line 204.

The scaler 176 scales the magnitude of the digital number on line 204 to give the magnitude of the Doppler frequency. With reference to the foregoing example, it is noted that the enabling interval of the counter 172 has a duration of approximately three seconds. Accordingly, the number of counts received on line 204 is approximately three times the Doppler frequency. Thus, the scaler 176 multiplies the magnitude of the number on line 204 by a factor of approximately ⅛ to provide the correct value of Doppler frequency shift to the digital filter 180.

The filter 180 comprises an averaging circuit which, in response to timing signals at terminal T25 stores and sums together a number of values of Doppler frequency, for example 8, and divides this sum by that number, 8 in this example, to give an average value of the nominal Doppler frequency $f_o$ on line 107. The digital numbers appearing on line 107 are then summed together, as noted hereinabove, with the digital numbers on line 131 by the summer 87 of FIG. 3. The sign bit of line 202 is retained during this summation and is utilized in the subsequent summation in the vector summer 50 of FIG. 4. Thereby, the sense of the Doppler frequency for each of the beams 24 of FIG. 1 is retained during the vector summation.

It is understood that the above described embodiment of the invention is illustrative only and that modifications thereof may occur to those skilled in the art. Accordingly, it is desired that this invention is not to be limited to the embodiment disclosed herein, but is to be limited only as defined by the appended claims.

What is claimed is:

1. A Doppler measurement system comprising:
   means for sampling a signal received during a predetermined interval of time, said means providing a predetermined number of samples of said received signal during said predetermined interval of time;
   means for obtaining the power spectrum of a set of said samples consisting of said predetermined number of samples;
   means coupled to said power spectrum means for forming the logarithm of said spectrum;
   means coupled to said logarithmic means for multiplying output signals thereof by orthogonal function factors; and
   means coupled to said multiplying means for combining products of said multiplying means to produce a component of a Doppler frequency.

2. A system according to claim 1 further comprising means for transmitting radiant energy during successive instances of time into a medium productive of echoes of said radiant energy, each of said echoes being received by said system to serve as said received signal, and means coupled to said sampling means for tracking the occurrences of said echoes, said tracking means providing said predetermined interval of time.

3. A system according to claim 1 wherein said sampling means includes a filter for extracting a nominal value of a Doppler frequency of said received signal, said sampling means further comprising means for offsetting a Doppler spectrum of said received signal by an amount of frequency equal to said nominal value of Doppler frequency.

4. A system according to claim 1 further comprising means for receiving a plurality of received signals from a plurality of directions, said received signal being one of said plurality of received signals, Doppler means coupled to said receiving means for producing a component of a Doppler frequency of a second received signal of said plurality of received signals, and means coupled to said combining means and to said Doppler means for vectorially summing said components of said Doppler frequencies to provide a magnitude and direction of a Doppler frequency resulting from a combination of Doppler frequencies of a plurality of said plurality of received signals.

5. In combination:
   means coupled to a medium propagative of radiant energy for producing echoes of radiant energy therefrom;
   means synchronized to said echo producing means for filtering a carrier frequency of said echoes;
   means coupled to said filtering means for providing samples of said echo having a frequency spectrum substantially centered about said carrier frequency;
   means for transforming a set of said samples to provide a set of orthogonal functions related to said set of samples;
   means coupled to said transforming means for taking the logarithm of said orthogonal functions; and
   means coupled to said logarithmic means for forming the weighted summation of said logarithms of said orthogonal functions to provide Doppler data of said echoes.

* * * * *